United States Patent [19]
Kirisawa

[11] Patent Number: 5,673,007
[45] Date of Patent: Sep. 30, 1997

[54] FREQUENCY SYNTHESIZER HAVING PLL RECEIVING FILTERED OUTPUT OF DDS

[75] Inventor: Akihiro Kirisawa, Tokyo, Japan

[73] Assignee: NEC Corporation, Tokyo, Japan

[21] Appl. No.: 630,124

[22] Filed: Apr. 10, 1996

[30] Foreign Application Priority Data

Apr. 10, 1995 [JP] Japan .................................... 7-083723

[51] Int. Cl.$^6$ .................................. H03L 7/06; H03L 7/16
[52] U.S. Cl. ................................ 331/18; 331/25; 327/106
[58] Field of Search .................. 331/18, 25; 327/106

[56] References Cited

U.S. PATENT DOCUMENTS 4,965,533  10/1990  Gilmore .................................... 331/25
5,428,308   6/1995  Maeda ......................................... 31/25

FOREIGN PATENT DOCUMENTS 5-122068  5/1993  Japan .

OTHER PUBLICATIONS

"Wideband PLL Synthesizer Using Linear Frequency Variation DDS as Reference Oscillator", The Transaction of the Institute of Electronics, Information and Communication Engineers, B-II, vol. J77-B-II, No. 7, pp. 349-358, Jul. 1994.

Primary Examiner—Siegfried H. Grimm
Attorney, Agent, or Firm—Foley & Lardner

[57] ABSTRACT

A frequency synthesizer includes a phase adder, a read only memory, a D/A converter, a bandpass filter, a low-pass filter, a phase comparator, a loop filter, a voltage controlled oscillator, and a frequency divider. The phase adder adds frequency setting data and output data of a plurality of bits every input clock to set the addition result as new output data. The read only memory outputs sine wave data on the basis of the output data from the phase adder. The D/A converter D/A-converts the sine wave data from the read only memory. The bandpass filter (particularly a switched capacitor filter) receives an output from the D/A converter and has a pass frequency which changes in accordance with the reference frequency of an output sine wave signal. The low-pass filter removes a high-frequency component from an output from the bandpass filter. The phase comparator compares the phase of an output from the low-pass filter with the phase of a frequency-divided output of the sine wave signal. The loop filter smooths an output from the phase comparator. The voltage controlled oscillator outputs the sine wave signal using an output from the loop filter as a control voltage. The frequency divider frequency-divides an output from the voltage controlled oscillator to output a result to the phase comparator.

9 Claims, 5 Drawing Sheets

FREQUENCY SYNTHESIZER HAVING PLL RECEIVING FILTERED OUTPUT OF DDS

BACKGROUND OF THE INVENTION

The present invention relates to a frequency synthesizer and, more particularly, to a frequency synthesizer using a small frequency step for a radio frequency band which is used in the field of communication.

A frequency synthesizer (FIG. 6) which is disclosed in Japanese Patent Laid-Open No. 5-122068 has conventionally been proposed as a method of realizing a frequency synthesizer using a small frequency step.

In FIG. 6, reference numeral 1 denotes a reference oscillator for outputting a clock CK having a frequency fr; 7, a direct digital synthesizer (to be referred to as a DDS hereinafter) for generating a sine wave signal (frequency fd) in accordance with the clock CK from the reference oscillator 1; 8, a phase comparator for comparing the phase of the sine wave signal output from the DDS 7 with the phase of an output from a frequency divider (to be described later); 9, a loop filter for smoothing an output from the phase comparator 8; 10, a voltage controlled oscillator (to be referred to as a VCO hereinafter) for obtaining an output frequency fo using an output from the loop filter 9 as a control voltage; and 11, a frequency divider for frequency-dividing an output from the VCO 10 to 1/N.

The DDS 7 has an arrangement shown in, e.g., FIG. 7. Reference numeral 12 denotes an M-bit phase adder for adding increment data K serving as frequency setting data every clock CK from the reference oscillator 1; 13, a sine table ROM for outputting sine wave data on the basis of output data from the phase adder 12; 14, a D/A converter for D/A-converting the sine wave data; and 15, a low-pass filter (to be referred to as an LPF hereinafter) for removing a high-frequency component from an output from the D/A converter 14.

In the DDS 7, an output from the phase adder 12, which is the result of adding the increment data K every clock CK having the frequency fr, is used as an address in the sine table ROM 13 to read out sine wave data (amplitude data) stored in the ROM 13. The D/A converter 14 converts the readout sine wave data into an analog signal, and the LPF 15 removes a high-frequency component from the analog signal to obtain a sine wave output having a frequency fd.

From the increment data K set in the phase adder 12, and the output frequency fr of the reference oscillator 1, the output frequency fd of the DDS 7 is given by equation (1):

$$fd = K \times fr/2^M \qquad (1)$$

The output frequency fo of the frequency synthesizer is a frequency obtained by multiplying the output frequency fd of the DDS 7 with a frequency division number (N) of the frequency divider 11, so that the output frequency fo is given by the following equation:

$$fo = N \times fd = N \times K \times fr/2^M \qquad (2)$$

A minimum frequency step is $N \times fr/2^M$.

In an output from the DDS 7 as shown in FIG. 7, an unnecessary spurious component is generated due to bit chopping (i.e., only upper bits of the μ-bit addition result are output) by the phase adder 12, the glitch and nonlinearity of the D/A converter 14, and the like.

This spurious component is increased N times by a PLL (Phase Locked Loop) constituted by the phase comparator 8, the loop filter 9, the voltage controlled oscillator (VCO) 10, and the frequency divider 11, resulting in a very large spurious component in an output from the frequency synthesizer. For example, when the output frequency of the DDS 7 is 10 MHz, and the frequency division number N of the PLL is 100, a spurious component of −20 dBc appears in the output from the frequency synthesizer even if the spurious ratio of the DDS 7 is −60 dBc.

As described above, an unnecessary spurious component is generated in an output from a conventional DDS, resulting in a very large spurious component in an output from the frequency synthesizer constituted by combining this DDS and a PLL.

SUMMARY OF THE INVENTION

It is an object of the present invention to provide a frequency synthesizer in which a spurious component is small, and a frequency step is small.

In order to achieve the above object, according to the present invention, there is provided a frequency synthesizer comprising phase addition means for adding frequency setting data and output data of a plurality of bits every input clock to set an addition result as new output data, memory means for outputting sine wave data on the basis of the output data from the phase addition means, D/A conversion means for D/A-converting the sine wave data from the memory means, first filter means for receiving an output from the D/A conversion means and setting a reference frequency of an output sine wave signal as a pass frequency, second filter means for removing a high-frequency component from an output from the first filter means, phase comparison means for comparing a phase of an output from the second filter means with a phase of a frequency-divided output of the sine wave signal, smoothing means for smoothing an output from the phase comparison means, a voltage controlled oscillator for outputting the sine wave signal using an output from the smoothing means as a control voltage, and frequency division means for frequency-dividing an output from the voltage controlled oscillator to output a result to the phase comparison means.

DESCRIPTION OF THE PREFERRED EMBODIMENT

Figure 1:
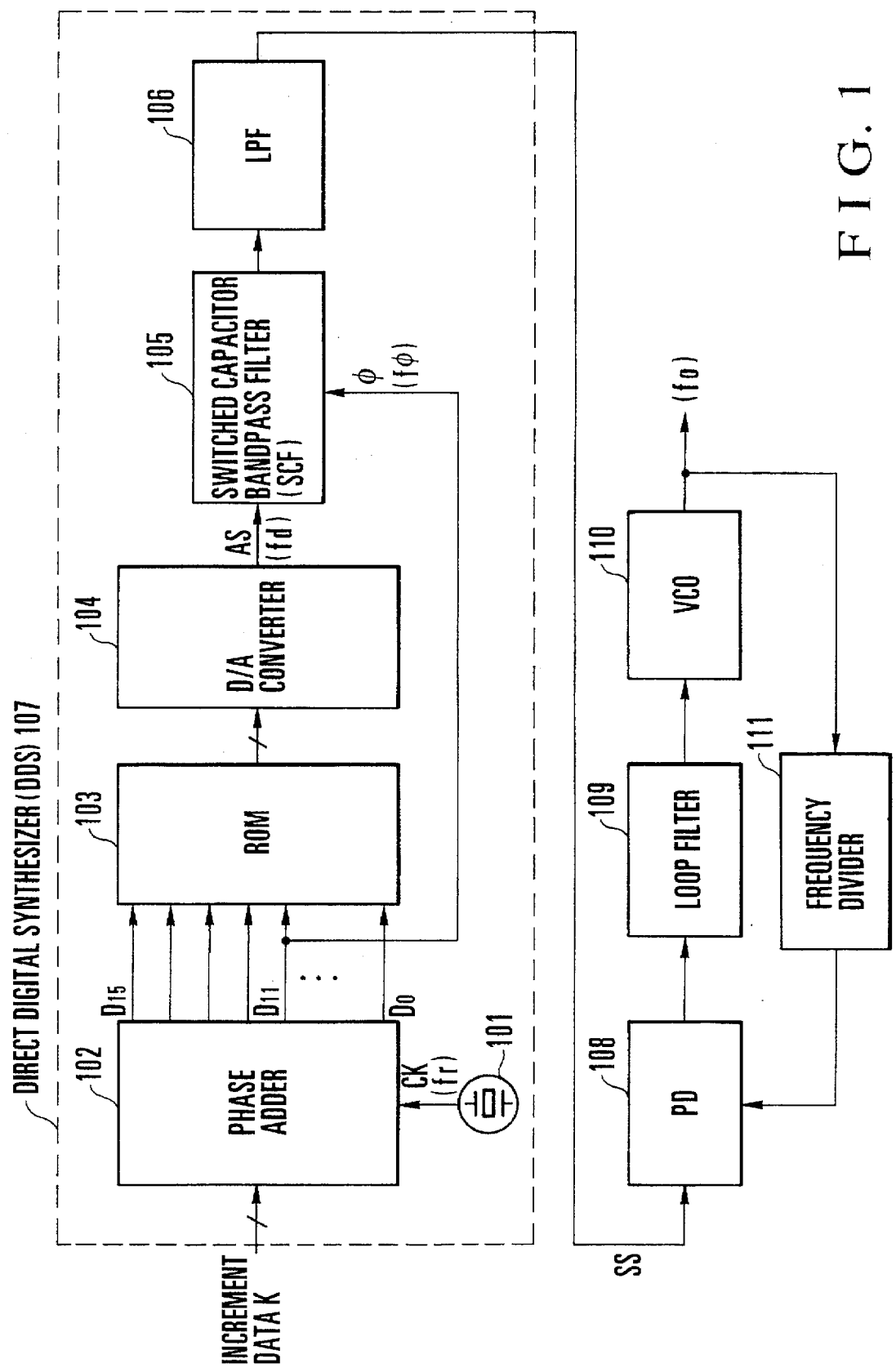
FIG. 1 is a block diagram showing a frequency synthesizer according to an embodiment of the present invention.

FIG. 1 shows a frequency synthesizer according to an embodiment of the present invention. In FIG. 1, reference numeral 101 denotes a reference oscillator for outputting a clock CK having a frequency fr; 102, a phase adder for adding increment data K serving as frequency setting data and output data every clock CK from the reference oscillator 101 to set this addition result as new output data; 103, a sine table ROM (Read Only Memory) for outputting sine wave data on the basis of the output data from the phase adder 102; 104, a D/A converter for D/A-converting the sine data having a frequency fd which is output from the sine table ROM 103; 105, a switched capacitor bandpass filter (to be referred to as an SCF hereinafter) for receiving an output AS from the D/A converter 104, and setting, as a pass frequency, a reference frequency of a sine wave signal SS which is an output from a DDS (to be described later); and 106, a low-pass filter (to be referred to as an LPF hereinafter) for removing a high-frequency component from an output from the SCF 105 to output the sine wave signal SS. The reference oscillator 101, the phase adder 102, the sine table ROM 103, the D/A converter 104, the SCF 105, and the LPF 106 constitute a direct digital synthesizer (to be referred to as a DDS hereinafter) 107.

Reference numeral 108 denotes a phase comparator for comparing the phase of the sine wave signal SS output from the LPF 106 of the DDS 107 with the phase of an output from a frequency divider (to be described later); 109, a loop filter for smoothing an output from the phase comparator 108; 110, a voltage controlled oscillator (to be referred to as a VCO hereinafter) for obtaining an output frequency fo using an output from the loop filter 109 as a control voltage; and 111, a frequency divider for frequency-dividing an output from the VCO 110 to 1/N, thereby outputting it to the phase comparator 108.

Next, the operation of this frequency synthesizer will be described.

The phase adder 102 adds the increment data K of M bits (32 bits in this embodiment) and phase data every time the clock CK having the frequency fr is input from the reference oscillator 101, and sets the result as new phase data. Phase data K is obtained at the first clock CK, and phase data 2K is obtained at the next clock CK.

The phase adder 102 outputs, of the M-bit addition result, upper 16 bits as output data to the ROM 103. In addition, of the output from the phase adder 102, the fifth bit D11 counted from the most significant bit D15 is input as a driving clock signal φ to the SCF 105. On the other hand, the sine table ROM 103 stores sine wave data (amplitude data) of each phase of a sine wave at each address. 12-bit sine wave data stored in the ROM 103 is read out by using the output data (phase data) from the phase adder 102 as an address.

The D/A converter 104 converts the sine wave data output from the ROM 103 into an analog signal AS to input it to the SCF 105. The SCF 105 is prepared by replacing a circuit resistor with a switched capacitor which is obtained by simulating the characteristics of the resistor in accordance with the clock signal φ and a capacitor. The characteristics of the filter can be determined by the capacitance of the capacitor and the clock signal φ.

Figures 2, 3A, 3B, 3C:
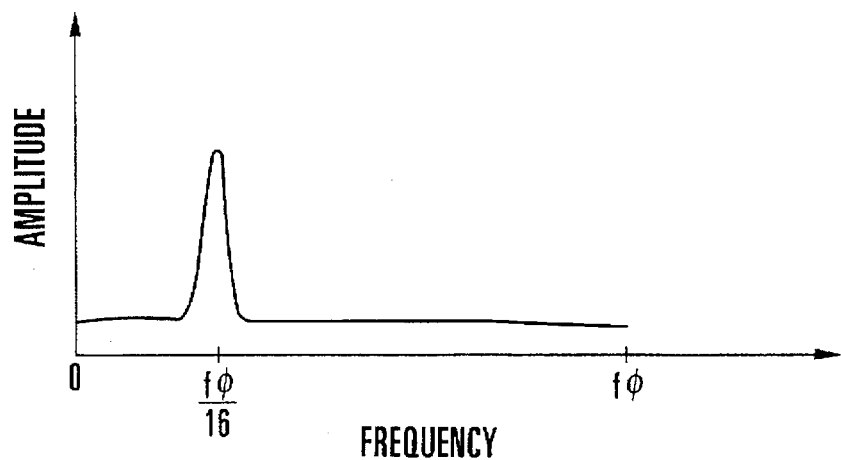
FIG. 2 is a graph showing the pass characteristics of a switched capacitor bandpass filter in FIG. 1.
FIGS. 3A to 3C are charts showing output waveforms at respective portions in the frequency synthesizer in FIG. 1.

As shown in FIG. 2, the SCF 105 of this embodiment operates as a bandpass filter having a center frequency as a fraction of a predetermined number (1/16 in this embodiment) of a frequency fφ of the driving clock signal φ. The output AS from the D/A converter 104 has a waveform, as shown in FIG. 3A, which includes various frequency components, as will be described later. To the contrary, the clock signal φ is the fifth output bit D11 from the phase adder 102, so that the clock signal φ has a square wave having a frequency 16 times the reference frequency fd (frequency of a sine wave component in FIG. 3A) in the output AS from the D/A converter 104.

With the above arrangement, the SCF 105 serves as a bandpass filter having the reference frequency fd as a center frequency, which extracts only a reference frequency component from the output AS from the D/A converter 104. Note that the reference frequency fd can be changed by changing the increment data K to be input to the phase adder 102 and phase data to be supplied to the ROM 103. The frequency fφ of the clock signal φ, however, also changes in accordance with the changed reference frequency fd. Accordingly, the pass frequency of the SCF 105 follows the reference frequency fd, and only the reference frequency component is extracted.

Figures 4A, 4B:
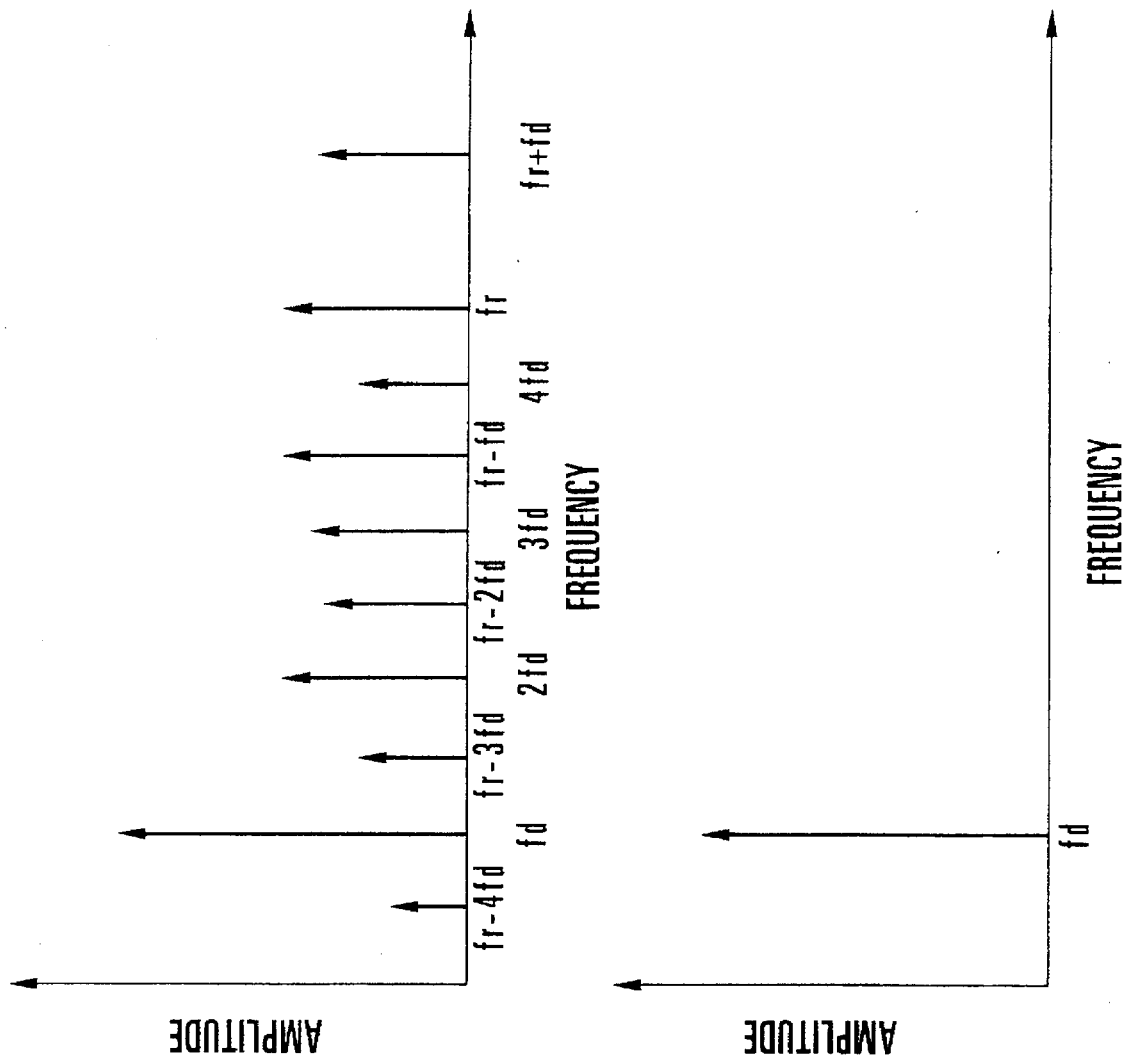
FIGS. 4A and 4B are graphs respectively showing the frequency spectra of outputs from a D/A converter and the switched capacitor bandpass filter in FIG. 1.

FIG. 4A shows a frequency spectrum of the output AS from the D/A converter 104. The output AS from the D/A converter 104 includes various frequency components such as image frequencies (fd+fr) and (fr−fd) caused by sampling, in addition to the reference frequency fd. These components are generated by influences of the nonlinearity and glitch of the D/A converter 104.

Figure 7:
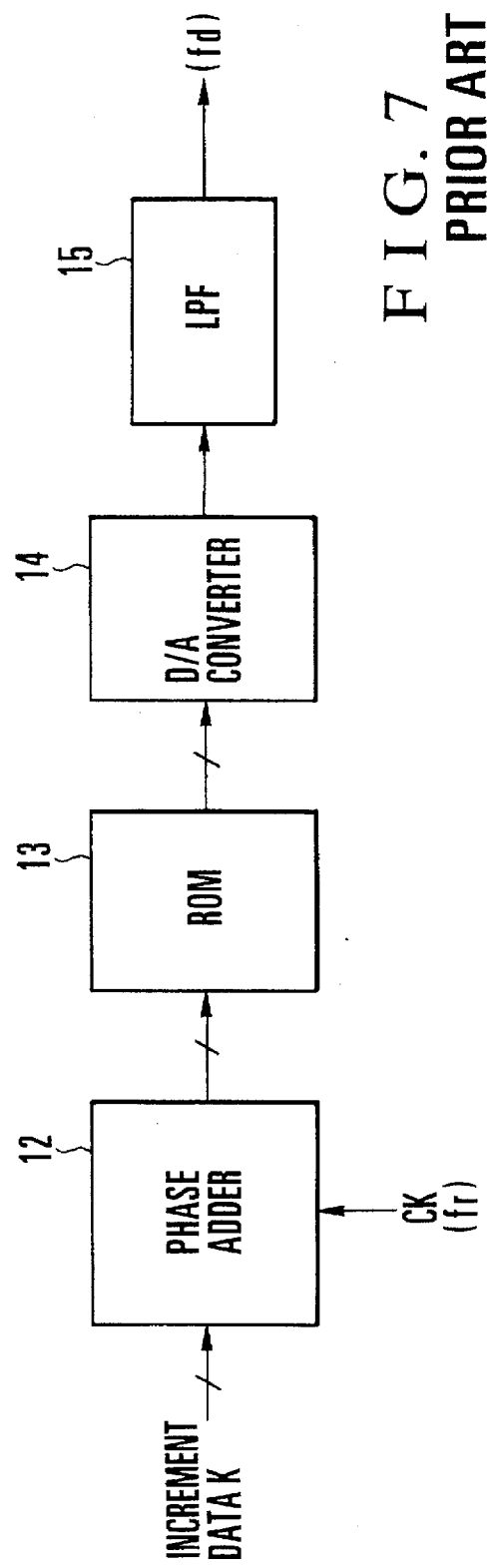
FIG. 7 is a block diagram showing a direct digital synthesizer shown in FIG. 6.

In the conventional DDS shown in FIG. 7, although frequency components apart from the reference frequency fd can be removed by the low-pass filter, unnecessary frequency components (fr−4fd) and (fr−3fd) near the reference frequency fd, and the like cannot be removed. In this embodiment, however, the unnecessary frequency components can be removed by the SCF 105, so that an output from the SCF 105 has a frequency spectrum as shown in FIG. 4B.

The output from the SCF 105 is input to the LPF 106. The LPF 106 is provided to prevent the clock signal φ from passing through the SCF 105 (clock field through). With the above arrangement, an output signal from the LPF 106, i.e., the sine wave signal SS serving as an output from the DDS 107 has a waveform free from unnecessary frequency components, as shown in FIG. 3C.

Figure 6:
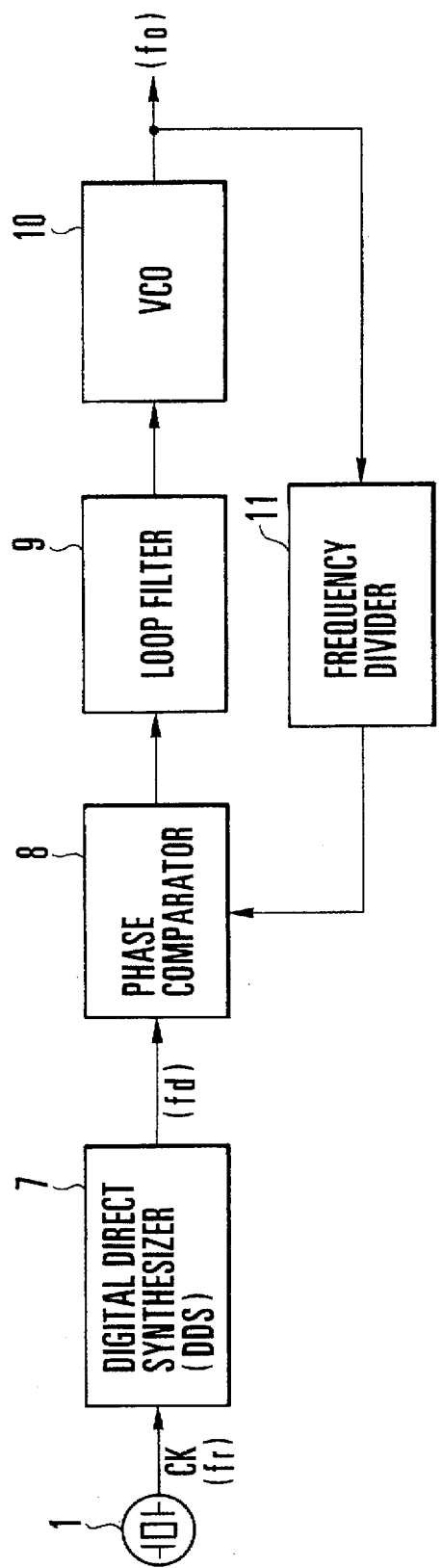
FIG. 6 is a block diagram showing a conventional frequency synthesizer.

The sine wave signal SS output from the DDS 107 is input to a PLL constituted by the phase comparator 108, the loop filter 109, the voltage controlled oscillator 110, and the frequency divider 111. The operation of this PLL is completely the same as that in the example of FIG. 6. As a result, the frequency fo of (N×fd) serves as the output frequency of this frequency synthesizer, as represented by the equation (3):

$$fo = N \times fd = N \times K \times fr/2^M \qquad (3)$$

Figure 5A:
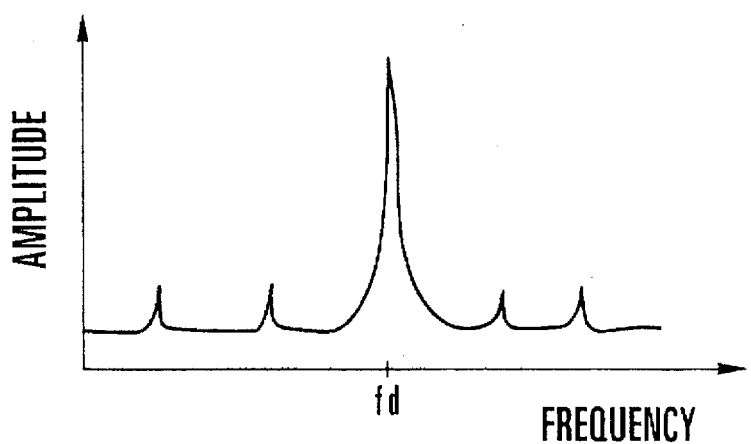
FIGS. 5A to 5D are graphs showing spurious states in outputs from respective portions in the frequency synthesizer in FIG. 1.
Figure 5B:
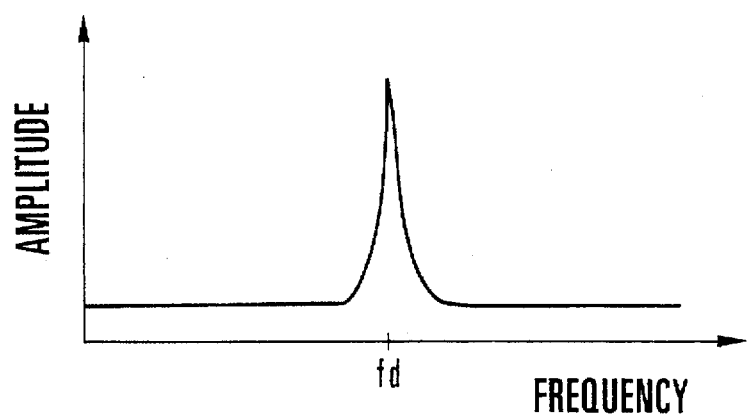

FIGS. 5A to 5D shows spurious states in outputs from respective portions in the frequency synthesizer of this embodiment. A spurious component as shown in FIG. 5A is generated near the reference frequency fd in the output AS from the D/A converter 104, while the spurious component is suppressed in the output SS from the LPF 106, as shown in FIG. 5B.

Figure 5C:
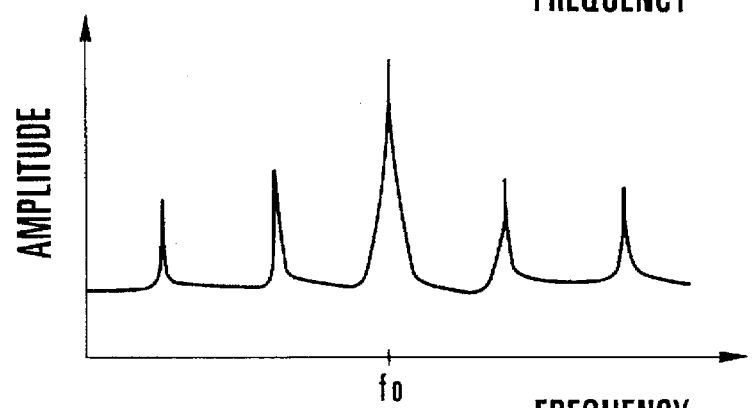
Figure 5D:
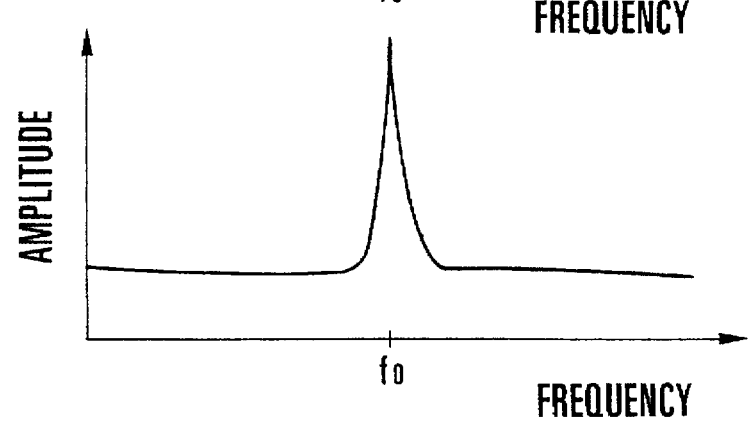

In the case of no SCF 105, since the spurious component is increased 20×logN times by the PLL, the spurious component undesirably increases in an output from the frequency synthesizer (output from the VCO 110), as shown in FIG. 5C. Such a frequency synthesizer is not suitable for practical use. To the contrary, according to this embodiment in which the SCF 105 is provided, an output signal free from unnecessary frequency components can be obtained, as shown in FIG. 5D.

Note that, in this embodiment, the SCF 105 having a pass frequency 1/16 the frequency fφ of the clock signal φ is used, but an SCF having another pass characteristic such as a pass frequency 1/8 the reference frequency fφ may be used. When the SCF having a pass frequency 1/8 the reference frequency fφ is used, the fourth bit D12 counted from the most significant bit D15 of an output from the phase adder 102 is set as the driving clock signal φ in accordance with this pass frequency.

According to the present invention, a bandpass filter using a reference frequency of a sine wave signal as a pass frequency is provided on the output stage of a D/A converter, thereby allowing a direct digital synthesizer to output a sine wave signal in which spurious components near the reference frequency are suppressed. An output signal which can be sufficiently practically used can be obtained from an output from a frequency synthesizer prepared by combining this digital synthesizer and a PLL constituted by a phase comparator, a loop filter, a voltage controlled oscillator, and a frequency divider. In addition, since the frequency synthesizer which is prepared by combining the direct digital synthesizer and the PLL and can be practically used can be realized, a radio-frequency-band synthesizer which draws a signal therein at a high speed with a very small frequency step can be constructed.

A bandpass filter using the reference frequency of the sine wave signal as a pass frequency can be realized by using a switched capacitor bandpass filter which has a pass frequency as a fraction of a predetermined number of the frequency of a driving clock signal, and receives, of an output from a phase adder, an output bit having a frequency a predetermined number of times the reference frequency, as the driving clock signal. The bandpass filter whose pass frequency changes following a change in reference frequency can be easily realized.

A bandpass filter using the reference frequency of the sine wave signal as a pass frequency can be realized by using a switched capacitor bandpass filter which has a pass frequency 1/16 the frequency of the driving clock signal, and receives, of the output from the phase adder, the fifth output bit from the most significant bit, as the driving clock signal. The bandpass filter whose pass frequency changes following a change in reference frequency can be easily realized.

What is claimed is:

1. A frequency synthesizer comprising:
   phase addition means for adding frequency setting data and output data of a plurality of bits every input clock to set an addition result as new output data;
   memory means for outputting sine wave data on the basis of the output data from said phase addition means;
   D/A conversion means for D/A-converting the sine wave data from said memory means;
   first filter means for receiving an output from said D/A conversion means and setting a reference frequency of an output sine wave signal as a pass frequency;
   second filter means for removing a high-frequency component from an output from said first filter means;
   phase comparison means for comparing a phase of an output from said second filter means with a phase of a frequency-divided output of the sine wave signal;
   smoothing means for smoothing an output from said phase comparison means;
   a voltage controlled oscillator for outputting the sine wave signal using an output from said smoothing means as a control voltage; and
   frequency division means for frequency-dividing an output from said voltage controlled oscillator to output a result to said phase comparison means.

2. A synthesizer according to claim 1, wherein the pass frequency of said first filter means changes in accordance with a driving clock signal.

3. A synthesizer according to claim 1, wherein said first filter means is constituted by a switched capacitor bandpass filter arranged such that a frequency which is equal to a fraction of a predetermined frequency of a driving clock signal is used as the pass frequency, and, of an output of a plurality of bits from said phase addition means, an output bit having a frequency a predetermined number of times the reference frequency is received as the driving clock signal.

4. A synthesizer according to claim 3, wherein said switched capacitor bandpass filter uses a frequency 1/16 the frequency of the driving clock signal as the pass frequency, and receives a fifth output bit counted from a most significant bit of the output from said phase addition means, as the driving clock signal.

5. A synthesizer according to claim 1, wherein said memory means is constituted by a read only memory having a sine table in which the sine wave data is stored in advance, and the sine wave data stored in said read only memory is read out by using the output data of the plurality of bits from said phase addition means as address data.

6. A synthesizer according to claim 1, wherein said phase addition means, said memory means, said D/A conversion means, said first filter means, and said second filter means constitute a direct digital synthesizer for generating the sine wave signal having the reference frequency.

7. A frequency synthesizer comprising:
   a phase adder for adding frequency setting data and output data of a plurality of bits every input clock to set an addition result as new output data;
   a read only memory having a sine table storing sine wave data to output the sine wave data on the basis of the output data from said phase adder;
   a D/A converter for D/A-converting the sine wave data from said read only memory;
   a bandpass filter for receiving an output from said D/A converter and setting a reference frequency of an output sine wave signal as a pass frequency;
   a low-pass filter for removing a high-frequency component from an output from said bandpass filter;
   a phase comparator for comparing a phase of an output from said low-pass filter with a phase of a frequency-divided output of the sine wave signal;
   a loop filter for smoothing an output from said phase comparator;
   a voltage controlled oscillator for outputting the sine wave signal using an output from said loop filter as a control voltage; and
   a frequency divider for frequency-dividing an output from said voltage controlled oscillator to output a result to said phase comparator.

8. A synthesizer according to claim 7, wherein said bandpass filter is constituted by a switched capacitor bandpass filter arranged such that a frequency which is equal to a fraction of a predetermined frequency of a driving clock signal is used as the pass frequency, and, of an output of a plurality of bits from said phase adder, an output bit having a frequency a predetermined number of times the reference frequency is received as the driving clock signal.

9. A frequency synthesizer comprising:
   a direct digital synthesizer for generating a sine wave signal;
   a bandpass filter for passing only a reference frequency signal of the sine wave signal output from said direct digital synthesizer on the basis of an output bit used in said direct digital synthesizer;
   a low-pass filter for removing a high-frequency component from an output from said bandpass filter; and
   a phase locked loop using an output signal from said low-pass filter as a reference comparison frequency.

* * * * *